United States Patent
Park et al.

(10) Patent No.: US 9,095,068 B2
(45) Date of Patent: Jul. 28, 2015

(54) CIRCUIT BOARD

(71) Applicant: SAMSUNG ELECTRO-MECHANICS CO., LTD., Gyunggi-do (KR)

(72) Inventors: Seung Wook Park, Gyunggi-do (KR); Chang Bae Lee, Gyunggi-do (KR); Christian Romero, Gyunggi-do (KR); Mi Jin Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 115 days.

(21) Appl. No.: 13/711,547

(22) Filed: Dec. 11, 2012

(65) Prior Publication Data

US 2013/0199833 A1    Aug. 8, 2013

(30) Foreign Application Priority Data

Feb. 3, 2012   (KR) .......................... 10-2012-0011396

(51) Int. Cl.
| | |
|---|---|
| H05K 1/11 | (2006.01) |
| H05K 7/10 | (2006.01) |
| H05K 7/00 | (2006.01) |
| H05K 1/02 | (2006.01) |
| H05K 3/46 | (2006.01) |

(52) U.S. Cl.
CPC .............. *H05K 1/115* (2013.01); *H05K 1/0251* (2013.01); *H05K 3/4644* (2013.01); *H05K 2201/09781* (2013.01)

(58) Field of Classification Search
USPC ........... 174/262–266; 361/767, 777, 792–795
See application file for complete search history.

(56) References Cited

U.S. PATENT DOCUMENTS

| | | | | |
|---|---|---|---|---|
| 5,421,083 | A  * | 6/1995 | Suppelsa et al. ................ | 29/852 |
| 7,312,486 | B1 * | 12/2007 | Lin et al. ........................ | 257/270 |
| 7,674,987 | B2 * | 3/2010 | Kodama et al. ................ | 174/260 |
| 7,812,262 | B2 * | 10/2010 | En ................................... | 174/262 |
| 2001/0038531 | A1 * | 11/2001 | Asai et al. ...................... | 361/794 |
| 2012/0081869 | A1 * | 4/2012 | Kim et al. ...................... | 361/782 |

FOREIGN PATENT DOCUMENTS

KR    1020100028209 A    3/2010

* cited by examiner

*Primary Examiner* — Timothy Thompson
*Assistant Examiner* — Sherman Ng
(74) *Attorney, Agent, or Firm* — Ladas & Parry, LLP

(57) ABSTRACT

Disclosed herein is a circuit board including: a base substrate including a via for power and a via pad for power connected to the via for power; and an insulating layer formed on the base substrate and including a dummy pattern formed in a region facing the via pad for power.

9 Claims, 2 Drawing Sheets

CIRCUIT BOARD

CROSS REFERENCE TO RELATED APPLICATION

This application claims the benefit of Korean Patent Application No. 10-2012-0011396, filed on Feb. 3, 2012, entitled "Circuit Board", which is hereby incorporated by reference in its entirety into this application.

BACKGROUND OF THE INVENTION

1. Technical Field

The present invention relates to a circuit board.

2. Description of the Related Art

As described in Patent Document 1, a general substrate of the related art, a thickness of a dielectric layer is secured to minimize an influence on capacitance, and the like, generated at the time of stacking layers of the substrate.

Meanwhile, the larger the spaced distance between electrodes formed on the substrate, the smaller the capacitance value. However, in the case of a thin substrate, the spaced distance between dielectrics may not be maximized.

Therefore, properties of the substrate itself are sensitively changed by parasitic capacitance generated at the time of stacking the layers of the substrate and parasitic capacitance generated in a through via.

In the case of forming a number of build-up layers, it is easy to control the capacitance; however, in the case of a thin typed substrate, it has a limitation in forming a build-up layer or a thickness of the dielectric layer, which is required for controlling the capacitance.

[Patent Document 1] KR 2010-028209 A 12 Mar. 2010

SUMMARY OF THE INVENTION

The present invention has been made in an effort to provide a circuit board capable of controlling parasitic capacitance generated in a substrate through a dummy pattern.

According to a preferred embodiment of the present invention, there is provided a circuit board including: a base substrate including a via for power and a via pad for power connected to the via for power; and an insulating layer formed on the base substrate and including a dummy pattern formed in a region facing the via pad for power.

The insulating layer may be configured of a plurality of layers, and the dummy pattern may be formed on an insulating layer spaced apart from the insulating layer having the via pad for power formed thereon by at least one layer.

The dummy pattern may have a cross-sectional area smaller than that of the via pad for power and larger than that of the via for power based on a length direction of the circuit board.

The via for power may have a cross-sectional area equal to or smaller than that of the via pad for power based on a length direction of the circuit board.

The via for power may be made of a conductive material.

The via for power may have an inner portion thereof filled with a conductive material.

The via for power may have an inner portion thereof filled with an insulating material.

The dummy pattern may be made of a conductive material.

A size of the dummy pattern may be controlled according to a magnitude of capacitance generated in the circuit board.

BRIEF DESCRIPTION OF THE DRAWINGS

The above and other objects, features and advantages of the present invention will be more clearly understood from the following detailed description taken in conjunction with the accompanying drawings, in which.

FIG. is a cross-sectional view showing a configuration of a circuit board according to a preferred embodiment of the present invention.

DESCRIPTION OF THE PREFERRED EMBODIMENTS

Figure 1:
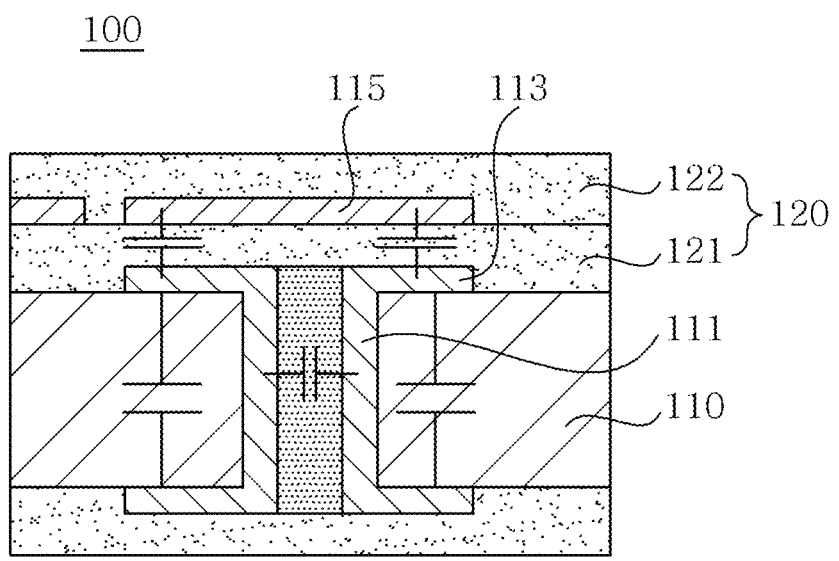

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Circuit Board

FIG. 1 is a view showing a configuration of an ultrasonic sensor according to a preferred embodiment of the present invention.

The circuit board 100 of the present invention may include a base substrate 110 including a via for power 111 and a via pad for power 113 connected to the via for power 111; and an insulating layer 120 formed on the base substrate 110 and including a dummy pattern 115 formed in a region facing the via pad for power 113.

The base substrate 110 may be a general insulating layer applied as a core substrate in a circuit board field or a circuit board having at least one circuit layer formed on the insulating layer.

As the insulating layer, a resin insulating layer may be used. As materials of the resin insulating layer, a thermo-setting resin such as an epoxy resin, a thermo-plastic resin such as a polyimide resin, a resin having a reinforcement material such as a glass fiber or an inorganic filler impregnated therein, for example, a prepreg may be used. In addition, a thermo-setting resin, a photo-setting resin, and the like, may be used. However, the materials of the resin insulating layer are not specifically limited thereto.

Figure 2:
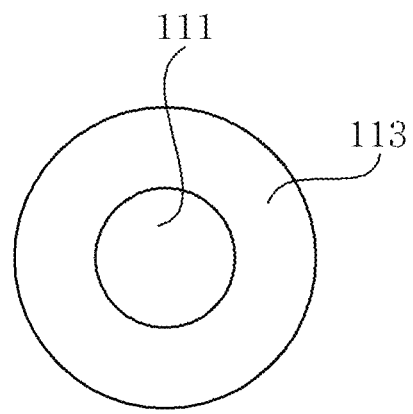
FIG. 2 is a plan view specifically showing a configuration of a via for power of the present invention.
Figure 3:
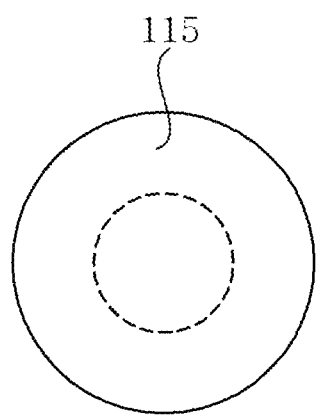
FIG. 3 is a plan view specifically showing a configuration of a dummy pattern of the present invention.

FIG. 2 is a plan view showing the via for power 111 in which the via pad for power 113 is formed, and FIG. 3 is a plan view showing the dummy pattern 115 formed on the via pad for power 113.

In the present invention, the artificial dummy pattern 115 is applied to an upper portion or a lower portion of the circuit pattern (the via for power and the via pad for power), such that a structure in which capacitors are connected in parallel with each other is implemented, thereby controlling the parasitic capacitance.

Here, the parasitic capacitance refers to an unnecessary capacitance generated in an impedance mismatch region in which impedance does not coincide with a defined value due to a via, a pad, or the like, in the circuit board.

More specifically, the dummy pattern 115 is implemented on the via pad for power 113 connected to the via for power 111 to improve loss of capacitance, thereby making it possible to control the parasitic capacitance.

Here, the dummy pattern 115 may be implemented in various shapes such as a circular shape, a donut shape, a polygonal shape, and the like, based on a length direction of the circuit board.

In FIG. 1, for convenience of description, the dummy pattern 115 is shown in an upper portion of the via for power 111; however, the dummy pattern 115 may be formed in an upper portion, a lower portion, or an upper and lower portion of the via for power 111.

In addition, the dummy pattern 115 may control a size thereof according to a magnitude of capacitance generated in the circuit board 100.

Further, in the dummy pattern 115, which controls the capacitance, an electrical connection is not made. However, the present invention is not limited thereto. That is, an electrical connection may also be made according to an operator's needs.

In addition, the size of the dummy pattern 115 may be in inverse proportion to a size of the via pad for power 113 based on a length direction of the circuit board.

That is, when the size of the via pad for power 113 is small, the size of the dummy pattern 115 is formed to be relatively larger than that of the via pad for power 113, and when the size of the via pad for power 113 is large, the size of the dummy pattern 115 is formed to be relatively smaller than that of the via pad for power 113, thereby making it possible to control a capacitance value.

Here, when determining the size of the dummy pattern 115, a spaced distance between an insulating layer in the via pad for power 113 and an insulating layer in the dummy pattern 115 may be additionally considered.

In addition, when determining the size of the dummy pattern 115, an influence of the via pad for power 113 and the via for power 111 on the capacitance may also be considered.

Further, the via pad for power 113 and the dummy pattern 115 may be implemented so that a region in which the via pad for power 113 and the dummy pattern 115 are overlapped with each other may be the minimum 20% based on a length direction of the circuit board. This is because the dummy pattern 115 is positioned in a region that may have an effect on the capacitance value in order to control the capacitance by the via for power 111 and the via pad for power 113.

Meanwhile, in the via pad for power 113, the dummy pattern 115, and the via for power 111, the dummy pattern 115 has a cross-sectional area which is smaller than that of the via pad for power 113, and the via for power 111 has a cross-sectional area which is smaller than that of the dummy pattern 115 based on a length direction of the circuit board.

Meanwhile, in the via pad for power 113 and the via for power 111, the via for power 111 has a cross-sectional area equal to or smaller than that of the via pad for power 113 based on a length direction of the circuit board 100.

In addition, the via for power 111 may be made of a conductive material, for example, copper.

Further, the via for power 111 may have an inner portion thereof filled with a conductive material.

Further, the via for power 111 may have an inner portion thereof filled with an insulating material.

In addition, the dummy pattern 115 may be made of a conductive material, which may be the same as a material of the via for power 111.

Meanwhile, the via pad for power 113 and the dummy pattern 115 may be formed by performing a patterning process through a subtractive method including coating an etching resist on a layer made of a conductive material such as copper (Cu), and then performing an exposure process, a development process, and an etching process to form a pattern, and an additive method including selectively precipitating the conductive material on the insulating layer by an electroless plating method, or the like, to form a pattern.

Here, the additive method may be classified into a full additive method only including an electroless plating process and a semi additive method performing an electro plating after performing an electroless plating process.

Meanwhile, the circuit board 100 disclosed in the present invention may be applied to an interposer substrate, a printed circuit board, a semiconductor substrate, a stacking type low temperature co-fired ceramic (LTCC) substrate, a stacking type high temperature co-fired ceramic (HTCC) substrate, and the like; however, the present invention is not specifically limited thereto.

In addition, the circuit board 100 disclosed in the present invention may be a thin typed substrate (for example, an insulating layer thereof has a thickness of 25 μm) which is required to have a limitation in a thickness, as compared to a general substrate not having a limitation in a thickness; however, it is not limited thereto.

The general substrate, which does not have a limitation in a thickness is capable of securing a thickness, secures a thickness of an insulating layer to increase a spaced distance between two electrodes, such that an influence of the capacitance generated at the time of stacking layers may be minimized; however, since the thin typed substrate has a limitation in a thickness of the insulating layer, it is difficult to control the capacitance value.

Therefore, properties of the thin typed substrate itself is sensitively changed by the capacitance generated at the time of stacking the layers or forming a through via.

The circuit board according to the present invention may have the dummy pattern formed on the via for power while having a thin typed structure, thereby making it possible to decrease an influence of the parasitic capacitance.

In addition, in the case in which the circuit board according to the present invention is a circuit board having a general structure, a process of stacking unnecessary layers may be decreased in order to control the capacitance value.

Figure 4:
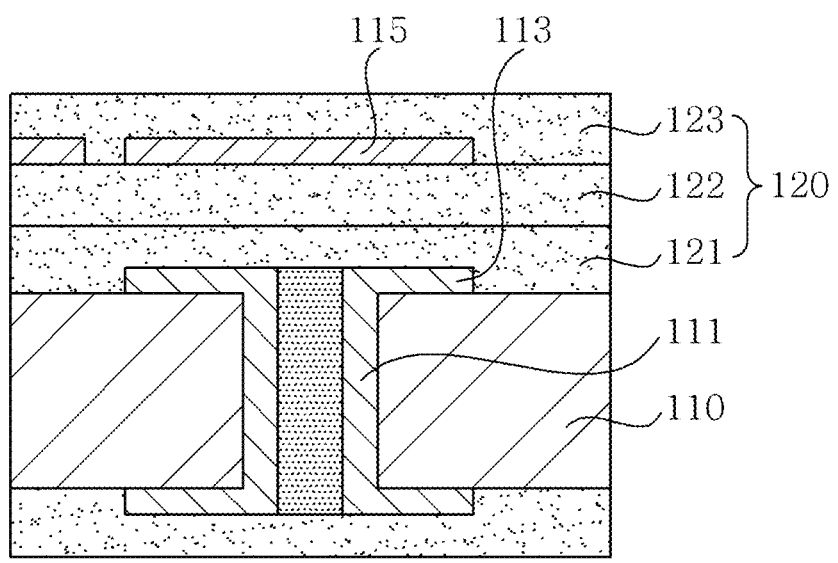
FIG. 4 is a cross-sectional view showing a configuration of a circuit board according to another preferred embodiment of the present invention.

FIG. 4 is a cross-sectional view showing a configuration of a circuit board according to another preferred embodiment of the present invention.

The circuit board 100 of the present invention may include a base substrate 110 including a via for power 111 and a via pad for power 113 connected to the via for power 111; and an insulating layer 120 formed on the base substrate 110 and including a dummy pattern 115 formed in a region facing the via pad for power 113.

Here, as shown in FIG. 4, the insulating layer 120 may be configured of a plurality of layers 121, 122, and 123.

Here, the dummy pattern 115 may be formed on an insulating layer 123 spaced apart from the insulating layer 121 having the via pad for power 113 formed thereon by at least one layer.

Therefore, as the spaced distance between the via pad for power 113 and the dummy pattern 115 becomes larger, the capacitance value becomes smaller, such that the size of the dummy pattern 115 may be formed so as to be smaller than that of a structure in which the spaced distance between the via pad for power 113 and the dummy pattern 115 is small, and thus it may be expected that an influence of the dummy pattern 115 on a design of the circuit board may be minimized.

The dummy pattern 115 is applied to the circuit board 100 structure according to the preferred embodiment of the present invention, such that, in view of an electrical effect, the parasitic capacitance may be controlled.

In addition, since the metals of all layers may be constantly maintained in terms of a process in the circuit board 100 according to the preferred embodiment of the present invention, it is easy to progress a substrate manufacturing process. For example, in the case of etching, a density effect may be controlled, and in the case of plating, current density may be constantly maintained.

As set forth above, with the circuit board according to the preferred embodiment of the present invention, the dummy pattern is applied to the upper portion or the lower portion of the via for power to improve the loss of the capacitance, thereby making it possible to control the parasitic capacitance present in the circuit board.

In addition, in the preferred embodiment of the present invention, the dummy pattern is applied to the upper portion of the via for power to control the parasitic capacitance, thereby making it possible to improve a degree of freedom in a design of the circuit board.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A circuit board comprising:
   a base substrate including a via for power and a via pad for power connected to the via for power; and
   an insulating layer formed on the base substrate and including a dummy pattern formed in a region facing the via pad for power,
   wherein the insulating layer is interposed between the via pad for power and the dummy pattern such that a capacitor is formed to control a parasitic capacitance generated in the circuit board.

2. The circuit board as set forth in claim 1, wherein the insulating layer is configured of a plurality of layers, and the dummy pattern is formed on an insulating layer spaced apart from the insulating layer having the via pad for power formed thereon by at least one layer.

3. The circuit board as set forth in claim 1, wherein the dummy pattern has a cross-sectional area smaller than that of the via pad for power and larger than that of the via for power based on a length direction of the circuit board.

4. The circuit board as set forth in claim 1, wherein the via for power has a cross-sectional area equal to or smaller than that of the via pad for power based on a length direction of the circuit board.

5. The circuit board as set forth in claim 1, wherein the via for power is made of a conductive material.

6. The circuit board as set forth in claim 1, wherein the via for power has an inner portion thereof filled with a conductive material.

7. The circuit board as set forth in claim 1, wherein the via for power has an inner portion thereof filled with an insulating material.

8. The circuit board as set forth in claim 1, wherein the dummy pattern is made of a conductive material.

9. The circuit board as set forth in claim 1, wherein a size of the dummy pattern is controlled according to a magnitude of capacitance generated in the circuit board.

\* \* \* \* \*